(12) United States Patent
Wittenberg

(10) Patent No.: US 7,329,008 B2
(45) Date of Patent: Feb. 12, 2008

(54) SHOCK-RESISTANT ARRANGEMENT FOR, AND METHOD OF, PROTECTING A HEAT SOURCE FROM DAMAGE

(75) Inventor: Carl Wittenberg, Water Mill, NY (US)

(73) Assignee: Symbol Technologies, Inc., Holtsville, NY (US)

( * ) Notice: Subject to any disclaimer, the term of this patent is extended or adjusted under 35 U.S.C. 154(b) by 266 days.

(21) Appl. No.: 11/133,893

(22) Filed: May 20, 2005

(65) Prior Publication Data

US 2006/0262821 A1 Nov. 23, 2006

(51) Int. Cl.
*G03B 21/14* (2006.01)
*G03B 21/16* (2006.01)
*G03B 21/22* (2006.01)
*H01S 3/04* (2006.01)

(52) U.S. Cl. .................. 353/52; 353/119; 353/121; 372/34; 362/259; 361/704

(58) Field of Classification Search .................. 353/52, 353/119, 121; 361/704; 372/34; 362/259
See application file for complete search history.

(56) References Cited

U.S. PATENT DOCUMENTS

| 5,309,457 A | * | 5/1994 | Minch | .......................... 372/34 |
| 6,007,218 A | * | 12/1999 | German et al. | ............. 362/259 |
| 6,212,070 B1 | * | 4/2001 | Atwood et al. | ............. 361/704 |

* cited by examiner

*Primary Examiner*—Melissa Jan Koval
(74) *Attorney, Agent, or Firm*—Kirschstein et al.

(57) ABSTRACT

A lightweight, compact image projection system, especially for mounting in a housing having a light-transmissive window, is operative for causing selected pixels in a raster pattern to be illuminated to produce an image of high resolution of VGA quality or higher in color. A shock-resistant arrangement protects at least one of the system components, for example, a green laser module with its associated thermo-electric cooler from shock damage during a drop event without sacrificing the capability of aggressively removing waste heat generated by such system components.

16 Claims, 7 Drawing Sheets

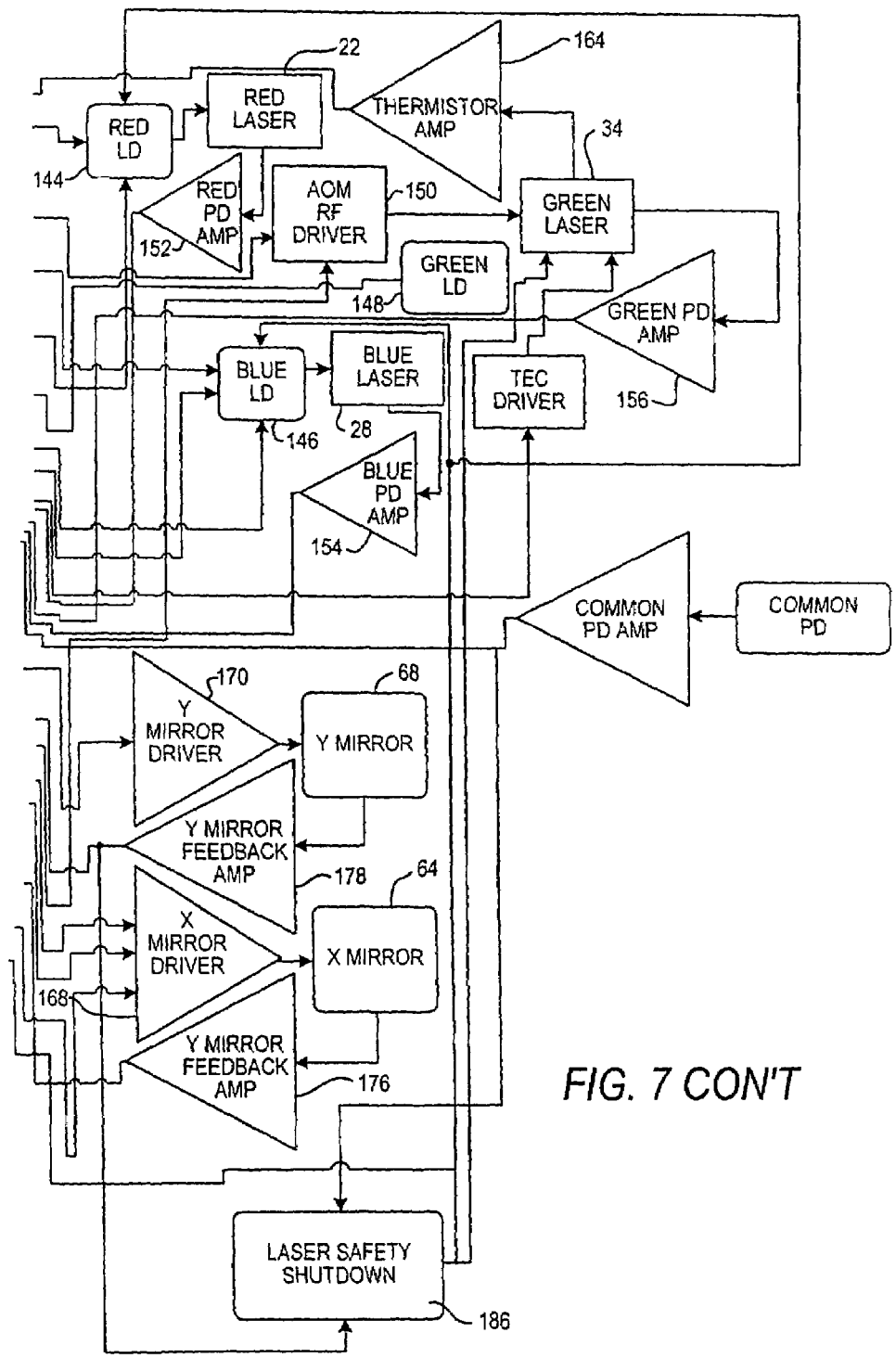
FIG. 7 CON'T

SHOCK-RESISTANT ARRANGEMENT FOR, AND METHOD OF, PROTECTING A HEAT SOURCE FROM DAMAGE

BACKGROUND OF THE INVENTION

1. Field of the Invention

The present invention generally relates to a shock-resistant arrangement for, and a method of, protecting a heat source from damage, especially for use in a color image projection system in which heat-generating lasers are used for projecting a two-dimensional image in color on a viewing surface away from the system.

2. Description of the Related Art

It is generally known to project a two-dimensional image on a screen based on a pair of scan mirrors which oscillate in mutually orthogonal directions to scan a laser beam over a raster pattern. However, the known image projection systems project the image with limited resolution, typically less than a fourth of video-graphics-array (VGA) quality of 640×480 pixels, and not in true color.

To obtain a true color image, red, blue and green laser beams emitted by lasers are needed. The red and blue lasers are semiconductor lasers and, when energized, produce their respective laser beams with concomitant generation of waste heat, which is typically readily dissipated to their common support and to the ambient environment. The currently available green laser, however, is not a semiconductor laser, but instead, is typically a laser module having an infrared diode-pumped YAG crystal laser and a non-linear frequency doubling crystal, whose operation produces a much greater amount of waste heat which must be aggressively transferred to the environment to prevent overheating. Indeed, a thermoelectric cooler is typically used to cool the green laser module, but the cooler also gives off heat which must be removed to prevent the cooler from overheating.

A heatsink is often used in the art to remove such heat. The heatsink is directly attached to the heat source in order to conduct heat therefrom. A problem arises, however, when the heat source is delicate, i.e., small and fragile, but nevertheless generates a great deal of heat, thereby requiring a heavy heatsink of large mass to remove the heat. A large heatsink rigidly attached to a delicate device, such as the aforementioned cooler, could cause failure of the device during a drop event, for example, if the system is implemented in a handheld instrument and is accidentally dropped to the floor. The cooler could crack, and the laser module attached to the cooler, could be moved out of optical alignment, thereby degrading the projected image.

SUMMARY OF THE INVENTION

Objects of the Invention

Accordingly, it is a general object of this invention to protect from shock damage a heat source requiring aggressive heat transfer.

Another object of this invention is to mechanically decouple and isolate a large heatsink mass from a heat source, while still providing a strong thermal transfer interface between the heatsink and the heat source.

Yet another object of this invention is to reduce, if not eliminate, image degradation caused by optical misalignment due to shock forces.

An additional object is to provide a shock-resistant color image projection system useful in many instruments of different form factors, especially handheld instruments.

Features of the Invention

In keeping with these objects and others which will become apparent hereinafter, one feature of this invention resides, briefly stated, in a shock-resistant arrangement for, and method of, protecting a heat source from damage. The heat source is supported by a support. A heatsink having a mass is provided in thermal transfer relation with the heat source to transfer heat therefrom.

In accordance with this invention, means are provided for mechanically decoupling the mass of the heatsink from the heat source by securing the heatsink to the support at a location remote from the heat source. Such means includes a bracket having a mounting leg on which the heatsink is mounted, and a support leg connected to the support. The bracket is adjustably positioned on the support to insure that there is an affirmative heat transfer contact between the heatsink and the heat source. However, in the case of a drop event where the arrangement is exposed to shock forces, sudden deceleration of the heatsink is not directly transmitted to the heat source, but instead, is transmitted directly to the support, which is more able than the heat source to survive such deceleration forces. As a result, the heat source is not damaged or dislodged from its position.

The shock-resistant arrangement of this invention is of particular benefit in an image projection system for projecting a two-dimensional, color image. The system includes a plurality of red, blue and green lasers for respectively emitting red, blue and green laser beams; an optical assembly for co-linearly arranging the laser beams to form a composite beam; a scanner for sweeping the composite beam as a pattern of scan lines in space at a working distance from the support, each scan line having a number of pixels; and a controller for causing selected pixels to be illuminated, and rendered visible, by the laser beams to produce the color image.

In the preferred embodiment, the scanner includes a pair of oscillatable scan mirrors for sweeping the composite beam along generally mutually orthogonal directions at different scan rates and at different scan angles. At least one of the scan rates exceeds audible frequencies, for example, over 18 kHz, to reduce noise. At least one of the scan mirrors is driven by an inertial drive to minimize power consumption. The image resolution preferably exceeds one-fourth of VGA quality, but typically equals or exceeds VGA quality. The support, lasers, scanner, controller and optical assembly preferably occupy a volume of less than thirty cubic centimeters.

The system is interchangeably mountable in housings of different form factors, including, but not limited to, a pen-shaped, gun-shaped or flashlight-shaped instrument, a personal digital assistant, a pendant, a watch, a computer, and, in short, any shape due to its compact and miniature size. The projected image can be used for advertising or signage purposes, or for a television or computer monitor screen, and, in short, for any purpose desiring something to be displayed.

In accordance with one aspect of this invention, at least one of the lasers, for example, the green laser, comprises a laser module having an infrared diode-pumped YAG crystal laser and a non-linear frequency doubling crystal, which in operation produce a great amount of waste heat which must be removed to prevent overheating. A thermo-electric cooler is used to cool the green laser module, but this too produces heat which must be removed, for example, by the heatsink described above.

However, a heatsink of large mass mechanically connected to a thermo-electric cooler which, by comparison, is a fragile structure, would likely crack the cooler during a drop event. The cooler being attached to the module might even cause the green laser beam emitted therefrom to be misaligned with the red and blue beams from the other lasers, thereby marring the projected image.

Hence, by mechanically connecting the heatsink not directly to the cooler, but instead, to the support, any such decelerating forces generated during a drop event would bypass the cooler and the green laser module. The heatsink is effectively mechanically isolated from the cooler, but is still in aggressive heat transfer contact therewith.

Still another feature of this invention is to position a thermally conductive pad between the mounting leg of the bracket and the cooler. The pad is adhered to the cooler, and is in sliding, floating contact with the mounting leg. The pad is also preferably compressible to insure that the mounting leg is tightly pressed against the pad, and is also preferably resilient to insure that any vibrations from the mounting leg are not transmitted to the cooler.

The novel features which are considered as characteristic of the invention are set forth in particular in the appended claims. The invention itself, however, both as to its construction and its method of operation, together with additional objects and advantages thereof, will be best understood from the following description of specific embodiments when read in connection with the accompanying drawings.

DETAILED DESCRIPTION OF THE PREFERRED EMBODIMENTS

Figures 1, 2:
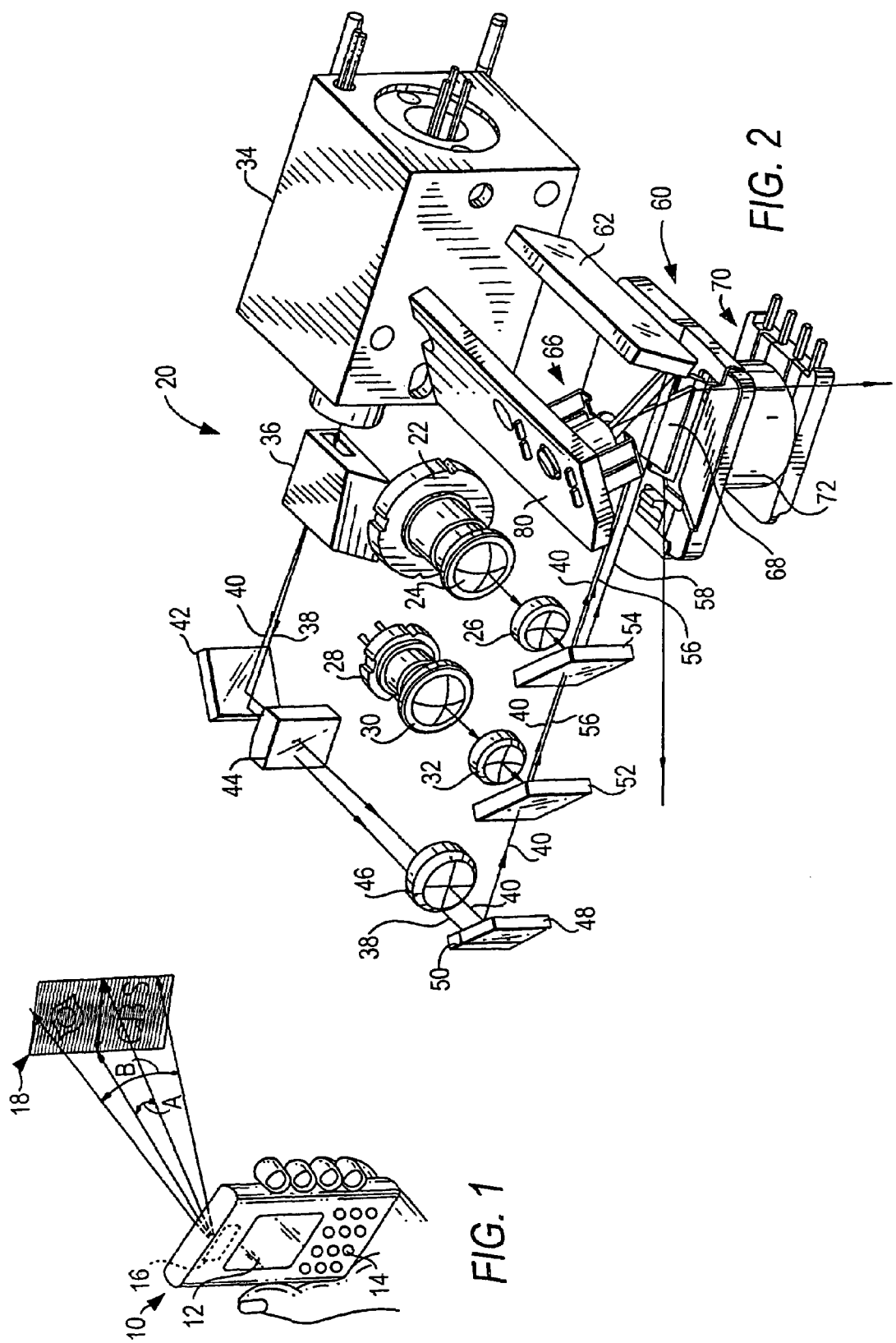
FIG. 1 is a perspective view of a hand-held instrument projecting an image at a working distance therefrom.
FIG. 2 is an enlarged, overhead, perspective view of an image projection system for installation in the instrument of FIG. 1.

Reference numeral 10 in FIG. 1 generally identifies a hand-held instrument, for example, a personal digital assistant, in which a lightweight, compact, image projection system 20, as shown in FIG. 2, is mounted and operative for projecting a two-dimensional color image at a variable distance from the instrument. By way of example, an image 18 is situated within a working range of distances relative to the instrument 10.

As shown in FIG. 1, the image 18 extends over an optical horizontal scan angle A extending along the horizontal direction, and over an optical vertical scan angle B extending along the vertical direction, of the image. As described below, the image is comprised of illuminated and non-illuminated pixels on a raster pattern of scan lines swept by a scanner in the arrangement 20.

The parallelepiped shape of the instrument 10 represents just one form factor of a housing in which the system 20 may be implemented. The instrument can be shaped as a pen, a cellular telephone, a clamshell or a wristwatch, as, for example, shown in U.S. patent application Ser. No. 10/090,653, filed Mar. 4, 2002, assigned to the same assignee as the instant application, and incorporated herein by reference thereto.

In the preferred embodiment, the system 20 measures less than about 30 cubic centimeters in volume. This compact, miniature size allows the system 20 to be mounted in housings of many diverse shapes, large or small, portable or stationary, including some having an on-board display 12, a keypad 14, and a window 16 through which the image is projected.

Figure 3:
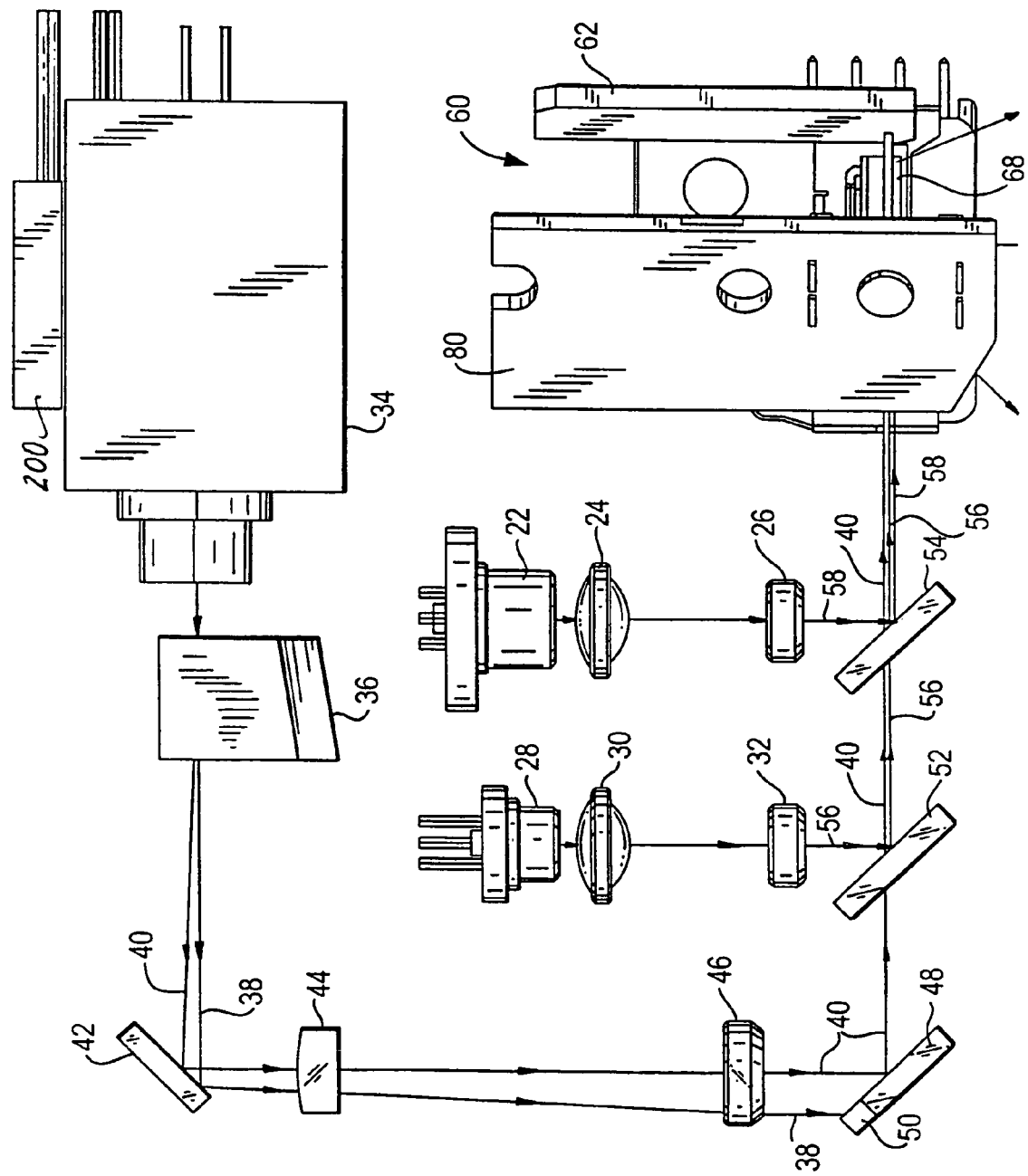
FIG. 3 is a top plan view of the arrangement of FIG. 2.
Figure 8:
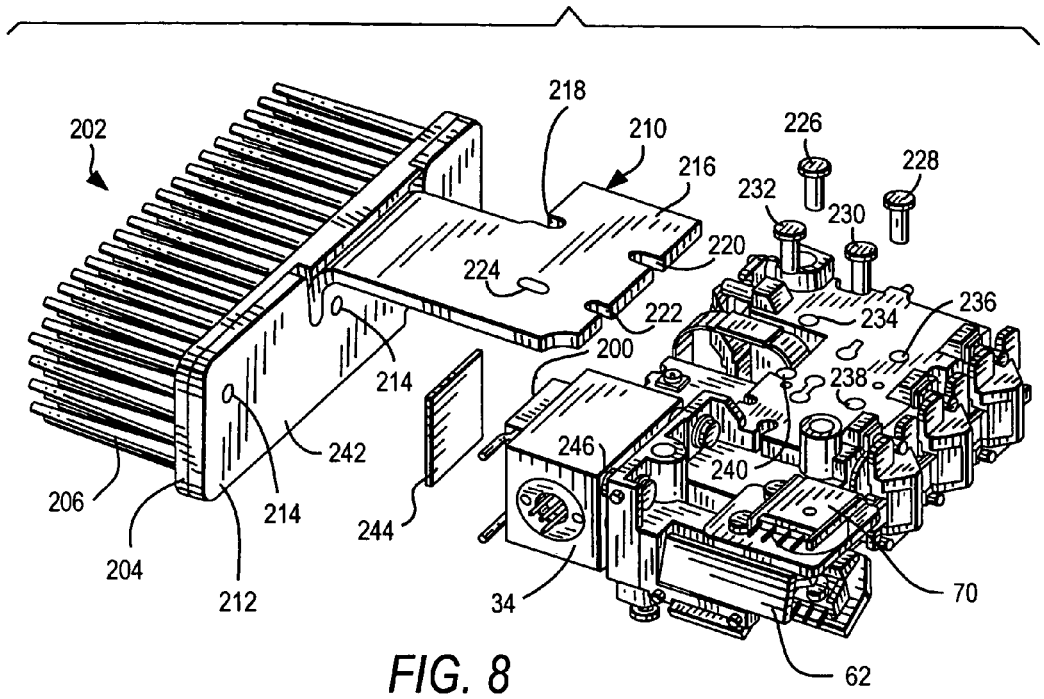
FIG. 8 is an exploded, inverted view of a shock-resistant arrangement in accordance with this invention for use with the system of FIG. 6.

Referring to FIGS. 2 and 3, the system 20 includes a semiconductor laser 22 which, when energized, emits a bright red laser beam at about 635-655 nanometers. Lens 24 is a biaspheric convex lens having a positive focal length and is operative for collecting virtually all the energy in the red beam and for producing a diffraction-limited beam. Lens 26 is a concave lens having a negative focal length. As best seen in FIG. 8, lenses 24, 26 are held by respective lens holders apart on a support (not illustrated in FIG. 2 for clarity) inside the instrument 10. The lenses 24, 26 shape the red beam profile over the working distance.

Another semiconductor laser 28 is mounted on the support and, when energized, emits a diffraction-limited blue laser beam at about 430-505 nanometers. Another biaspheric convex lens 30 and a concave lens 32 are employed to shape the blue beam profile in a manner analogous to lenses 24, 26.

A green laser beam having a wavelength on the order of 530 nanometers is generated not by a semiconductor laser, but instead by a green laser module 34 having an infrared diode-pumped YAG crystal laser whose output beam is 1060 nanometers. A non-linear frequency doubling crystal is included in the infrared laser cavity between the two laser mirrors. Since the infrared laser power inside the cavity is much larger than the power coupled outside the cavity, the frequency doubler is more efficient in generating the double frequency green light inside the cavity. The output mirror of the laser is reflective to the 1060 nm infrared radiation, and transmissive to the doubled 530 nm green laser beam. Since the correct operation of the solid-state laser and frequency doubler require precise temperature control, a semiconductor device such as a thermoelectric cooler 200 relying on the Peltier effect is used to control the temperature of the green laser module. The thermo-electric cooler 200 can either heat or cool the green laser module depending on the polarity of the applied current. A thermistor is part of the green laser module in order to monitor its temperature. The readout from the thermistor is fed to the controller, which adjusts the control current to the thermoelectric cooler 200 accordingly.

As explained below, the lasers are pulsed in operation at frequencies on the order of 100 MHz. The red and blue semiconductor lasers 22,28 can be pulsed at such high frequencies, but the currently available green solid-state lasers cannot. As a result, the green laser beam exiting the green module 34 is pulsed with an acousto-optical modulator 36 which creates an acoustic standing wave inside a crystal for diffracting the green beam. The modulator 36, however, produces a zero-order, non-diffracted beam 38 and a first-order, pulsed, diffracted beam 40. The beams 38, 40 diverge from each other and, in order to separate them to eliminate the undesirable zero-order beam 38, the beams 38, 40 are routed along a long, folded path having a folding mirror 42. Alternatively, an electro-optic, modulator can be used either externally or internally to the green laser module to pulse the green laser beam. Other possible ways to modulate the green laser beam include electro-absorption modulation, or Mach-Zender interferometer. The beams 38, 40 are routed through positive and negative lenses 44, 46. However, only the diffracted green beam 40 is allowed to impinge upon, and reflect from, the folding mirror 48. The non-diffracted beam 38 is absorbed by an absorber 50, preferably mounted on the mirror 48.

The system includes a pair of dichroic filters 52, 54 arranged to make the green, blue and red beams as co-linear as possible before reaching a scanning assembly 60. Filter 52 allows the green beam 40 to pass therethrough, but the blue beam 56 from the blue laser 28 is reflected by the interference effect. Filter 54 allows the green and blue beams 40, 56 to pass therethrough, but the red beam 58 from the red laser 22 is reflected by the interference effect.

Figure 4:
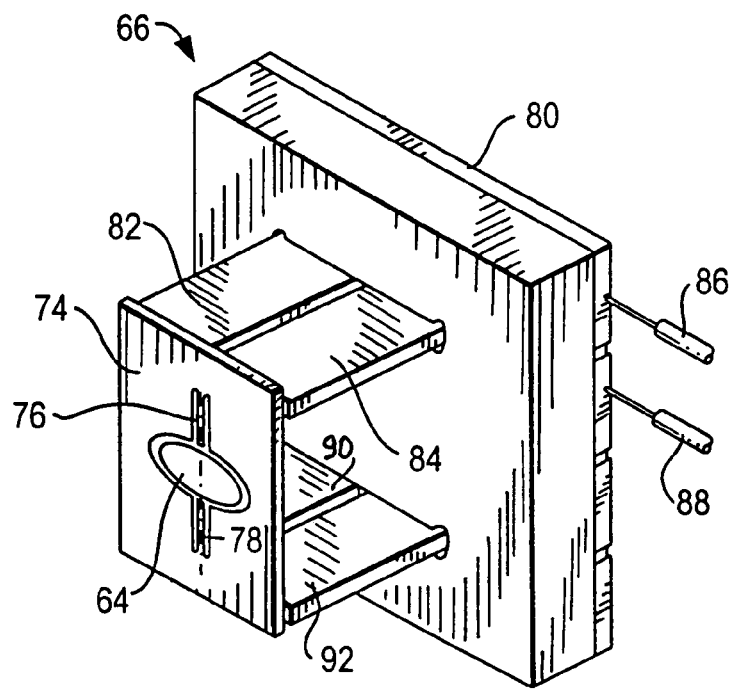
FIG. 4 is a perspective front view of an inertial drive for use in the system of FIG. 2.
Figure 5:
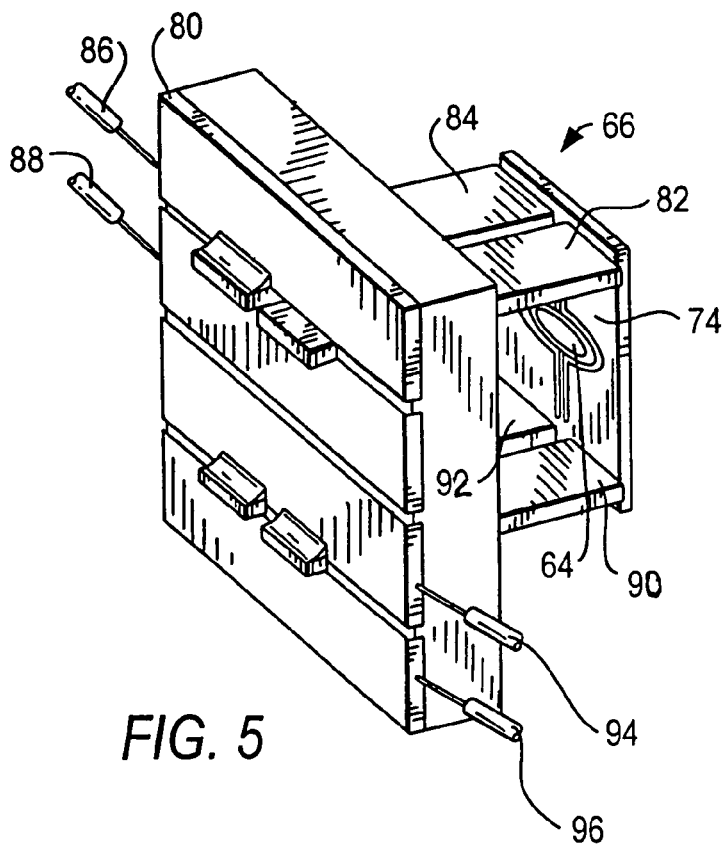
FIG. 5 is a perspective rear view of the inertial drive of FIG. 4.

The nearly co-linear beams 40, 56, 58 are directed to, and reflected off, a stationary bounce mirror 62. The scanning assembly 60 includes a first scan mirror 64 oscillatable by an inertial drive 66 (shown in isolation in FIGS. 4-5) at a first scan rate to sweep the laser beams reflected off the bounce mirror 62 over the first horizontal scan angle A, and a second scan mirror 68 oscillatable by an electromagnetic drive 70 at a second scan rate to sweep the laser beams reflected off the first scan mirror 64 over the second vertical scan angle B. In a variant construction, the scan mirrors 64, 68 can be replaced by a single two-axis mirror.

The inertial drive 66 is a high-speed, low electrical power-consuming component. Details of the inertial drive can be found in U.S. patent application Ser. No. 10/387,878, filed Mar. 13, 2003, assigned to the same assignee as the instant application, and incorporated herein by reference thereto. The use of the inertial drive reduces power consumption of the scanning assembly 60 to less than one watt and, in the case of projecting a color image, as described below, to less than ten watts.

The drive 66 includes a movable frame 74 for supporting the scan mirror 64 by means of a hinge that includes a pair of co-linear hinge portions 76, 78 extending along a hinge axis and connected between opposite regions of the scan mirror 64 and opposite regions of the frame. The frame 74 need not surround the scan mirror 64, as shown.

The frame, hinge portions and scan mirror are fabricated of a one-piece, generally planar, silicon substrate which is approximately 150μ thick. The silicon is etched to form omega-shaped slots having upper parallel slot sections, lower parallel slot sections, and U-shaped central slot sections. The scan mirror 64 preferably has an oval shape and is free to move in the slot sections. In the preferred embodiment, the dimensions along the axes of the oval-shaped scan mirror measure 749μ×1600μ. Each hinge portion measure 27μ in width and 1130μ in length. The frame has a rectangular shape measuring 3100μ in width and 4600μ in length.

The inertial drive is mounted on a generally planar, printed circuit board 80 and is operative for directly moving the frame and, by inertia, for indirectly oscillating the scan mirror 64 about the hinge axis. One embodiment of the inertial drive includes a pair of piezoelectric transducers 82, 84 extending perpendicularly of the board 80 and into contact with spaced apart portions of the frame 74 at either side of hinge portion 76. An adhesive may be used to insure a permanent contact between one end of each transducer and each frame portion. The opposite end of each transducer projects out of the rear of the board 80 and is electrically connected by wires 86, 88 to a periodic alternating voltage source (not shown).

In use, the periodic signal applies a periodic drive voltage to each transducer and causes the respective transducer to alternatingly extend and contract in length. When transducer 82 extends, transducer 84 contracts, and vice versa, thereby simultaneously pushing and pulling the spaced apart frame portions and causing the frame to twist about the hinge axis. The drive voltage has a frequency corresponding to the resonant frequency of the scan mirror. The scan mirror is moved from its initial rest position until it also oscillates about the hinge axis at the resonant frequency. In a preferred embodiment, the frame and the scan mirror are about 150μ thick, and the scan mirror has a high Q factor. A movement on the order of 1μ by each transducer can cause oscillation of the scan mirror at scan rates in excess of 20 kHz.

Another pair of piezoelectric transducers 90,92 extends perpendicularly of the board 80 and into permanent contact with spaced apart portions of the frame 74 at either side of hinge portion 78. Transducers 90, 92 serve as feedback devices to monitor the oscillating movement of the frame and to generate and conduct electrical feedback signals along wires 94, 96 to a feedback control circuit (not shown).

Alternately, instead of using piezo-electric transducers 90,92 for feedback, magnetic feedback can be used, where a magnet is mounted on the back of the high-speed mirror, and an external coil is used to pickup the changing magnetic field generated by the oscillating magnet.

Although light can reflect off an outer surface of the scan mirror, it is desirable to coat the surface of the mirror 64 with a specular coating made of gold, silver, aluminum, or a specially designed highly reflective dielectric coating.

The electromagnetic drive 70 includes a permanent magnet jointly mounted on and behind the second scan mirror 68, and an electromagnetic coil 72 operative for generating a periodic magnetic field in response to receiving a periodic drive signal. The coil 72 is adjacent the magnet so that the periodic field magnetically interacts with the permanent field of the magnet and causes the magnet and, in turn, the second scan mirror 68 to oscillate.

The inertial drive 66 oscillates the scan mirror 64 at a high speed at a scan rate preferably greater than 5 kHz and, more particularly, on the order of 18 kHz or more. This high scan rate is at an inaudible frequency, thereby minimizing noise and vibration. The electromagnetic drive 70 oscillates the scan mirror 68 at a slower scan rate on the order of 40 Hz which is fast enough to allow the image to persist on a human eye retina without excessive flicker.

The faster mirror 64 sweeps a horizontal scan line, and the slower mirror 68 sweeps the horizontal scan line vertically, thereby creating a raster pattern which is a grid or sequence of roughly parallel scan lines from which the image is constructed. Each scan line has a number of pixels. The image resolution is preferably XGA quality of 1024×768 pixels. Over a limited working range we can display high-definition television standard, denoted 720 p, 1270×720 pixels. In some applications, a one-half VGA quality of 320×480 pixels, or one-fourth VGA quality of 320×240 pixels, is sufficient. At minimum, a resolution of 160×160 pixels is desired.

The roles of the mirrors 64, 68 could be reversed so that mirror 68 is the faster, and mirror 64 is the slower. Mirror 64 can also be designed to sweep the vertical scan line, in which event, mirror 68 would sweep the horizontal scan line. Also, the inertial drive can be used to drive the mirror 68. Indeed, either mirror can be driven by an electromechanical, electrical, mechanical, electrostatic, magnetic, or electromagnetic drive.

The slow-mirror is operated in a constant velocity sweep-mode during which time the image is displayed. During the mirror's return, the mirror is swept back into the initial position at its natural frequency, which is significantly higher. During the mirror's return trip, the lasers can be powered down in order to reduce the power consumption of the device.

Figure 6:
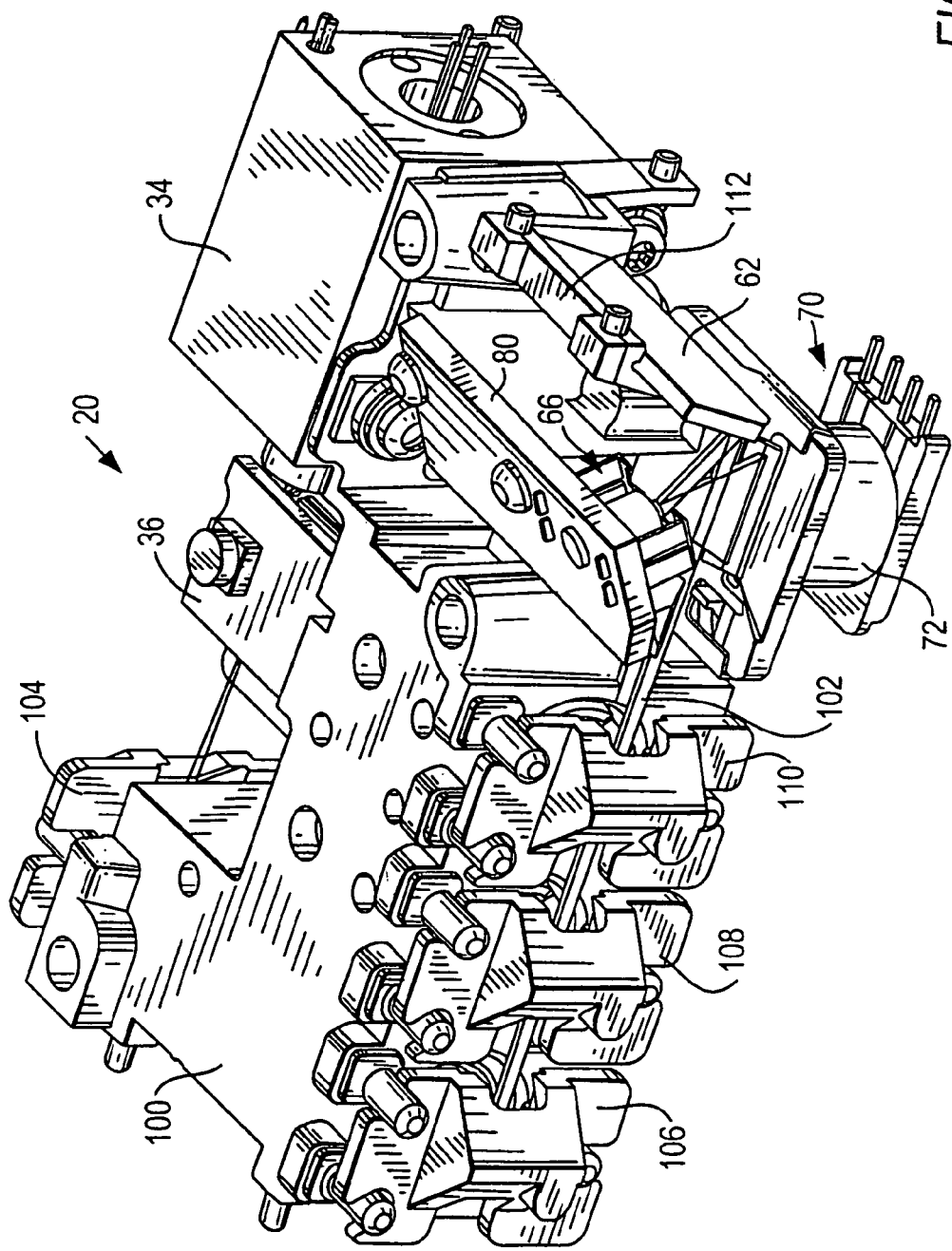
FIG. 6 is a perspective view of a practical implementation of the system of FIG. 2.

FIG. 6 is a practical implementation of the system 20 in the same perspective as that of FIG. 2. The aforementioned components are mounted on a support which includes a top cover 100 and a support plate 102. Holders 104, 106, 108, 110, 112 respectively hold folding mirrors 42, 48, filters 52, 54 and bounce mirror 62 in mutual alignment. Each holder has a plurality of positioning slots for receiving positioning posts stationarily mounted on the support. Thus, the mirrors and filters are correctly positioned. As shown, there are three posts, thereby permitting two angular adjustments and one lateral adjustment. Each holder can be glued in its final position.

The image is constructed by selective illumination of the pixels in one or more of the scan lines. As described below in greater detail with reference to FIG. 7, a controller 114 causes selected pixels in the raster pattern to be illuminated, and rendered visible, by the three laser beams. For example, red, blue and green power controllers 116, 118, 120 respectively conduct electrical currents to the red, blue and green lasers 22, 28, 34 to energize the latter to emit respective light beams at each selected pixel, and do not conduct electrical currents to the red, blue and green lasers to deenergize the latter to non-illuminate the other non-selected pixels. The resulting pattern of illuminated and non-illuminated pixels comprise the image, which can be any display of human- or machine-readable information or graphic.

Referring to FIG. 1, the raster pattern is shown in an enlarged view. Starting at an end point, the laser beams are swept by the inertial drive along the horizontal direction at the horizontal scan rate to an opposite end point to form a scan line. Thereupon, the laser beam's are swept by the electromagnetic drive 70 along the vertical direction at the vertical scan rate to another end point to form a second scan line. The formation of successive scan lines proceeds in the same manner.

The image is created in the raster pattern by energizing or pulsing the lasers on and off at selected times under control of the microprocessor 114 or control circuit by operation of the power controllers 116, 118, 120. The lasers produce visible light and are turned on only when a pixel in the desired image is desired to be seen. The color of each pixel is determined by one or more of the colors of the beams. Any color in the visible light spectrum can be formed by the selective superimposition of one or more of the red, blue, and green lasers. The raster pattern is a grid made of multiple pixels on each line, and of multiple lines. The image is a bit-map of selected pixels. Every letter or number, any graphical design or logo, and even machine-readable bar code symbols, can be formed as a bit-mapped image.

Figure 7:
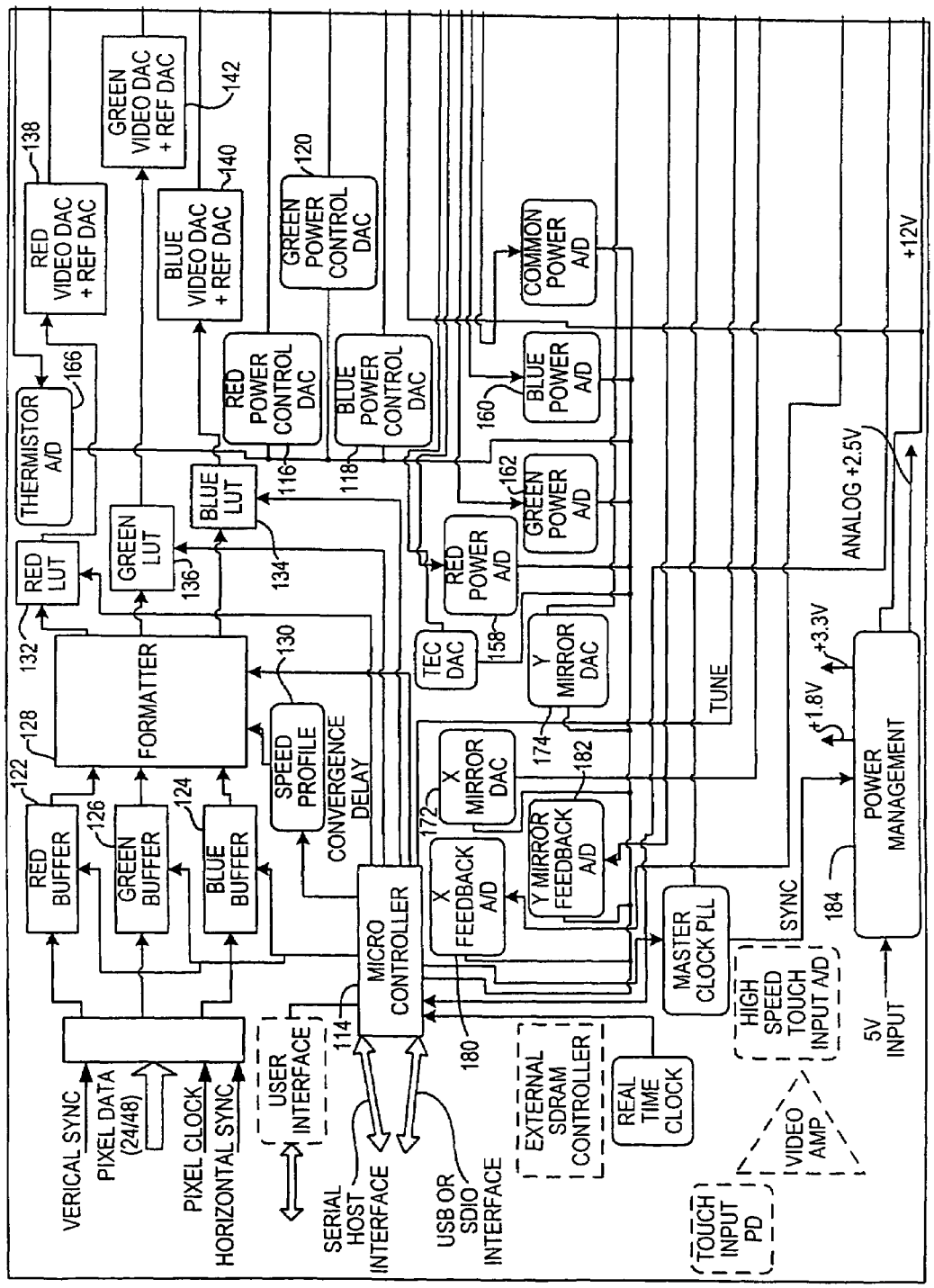
FIG. 7 is an electrical schematic block diagram depicting operation of the system of FIG. 2.

As shown in FIG. 7, an incoming video signal having vertical and horizontal synchronization data, as well as pixel and clock data, is sent to red, blue and green buffers 122, 124, 126 under control of the microprocessor 114. The storage of one full VGA frame requires many kilobytes, and it would be desirable to have enough memory in the buffers for two full frames to enable one frame to be written, while another frame is being processed and projected. The buffered data is sent to a formatter 128 under control of a speed profiler 130 and to red, blue and green look up tables (LUTs) 132, 134, 136 to correct inherent internal distortions caused by scanning, as well as geometrical distortions caused by the angle of the display of the projected image. The resulting red, blue and green digital signals are converted to red, blue and green analog signals by digital to analog converters (DACs) 138, 140, 142. The red and blue analog signals are fed to red and blue laser drivers (LDs) 144, 146 which are also connected to the red and blue power controllers 116, 118. The green analog signal is fed to an acousto-optical module (AOM) radio frequency (RF) driver 150 and, in turn, to the green laser 34 which is also connected to a green LD 148 and to the green power controller 120.

Feedback controls are also shown in FIG. 7, including red, blue and green photodiode amplifiers 152, 154, 156 connected to red, blue and green analog-to-digital (A/D) converters 158, 160, 162 and, in turn, to the microprocessor 114. Heat is monitored by a thermistor amplifier 164 connected to an A/D converter 166 and, in turn, to the microprocessor.

The scan mirrors 64, 68 are driven by drivers 168, 170 which are fed analog drive signals from DACs 172, 174 which are, in turn, connected to the microprocessor. Feedback amplifiers 176, 178 detect the position of the scan mirrors 64, 68, and are connected to feedback A/Ds 180, 182 and, in turn, to the microprocessor.

A power management circuit 184 is operative to minimize power while allowing fast on-times, preferably by keeping the green laser on all the time, and by keeping the current of the red and blue lasers just below the lasing threshold.

A laser safety shut down circuit 186 is operative to shut the lasers off if either of the scan mirrors 64, 68 is detected as being out of position.

Turning now to FIG. 8, the FIG. 6 arrangement has been turned and inverted to provide a better view of the green laser module 34 and its thermo-electric cooler 200. As previously mentioned, the waste heat generated by the module 34 is cooled by the cooler 200 and, in turn, the cooler 200 generates heat which must be aggressively removed to prevent overheating of the cooler and the module 34. A heatsink 202 having a planar base 204 and a multitude of cooling fins 206 projecting from the base 204 is employed for such heat removal. The fins 206 collectively have a large heatsink outer surface for efficient and rapid thermal transfer. The fins also have good aerodynamics such that air can easily and quickly flow through and around all the fins. The heatsink is preferably made of aluminum which is relatively light in weight as compared to other heatsink materials, such as copper, and has a relatively high thermal conductivity, e.g., 205 W/mK, which is four times better than steel, for example.

As previously mentioned, the cooler 200 is a relatively fragile device. Its outer surface is ceramic and is easily cracked when subjected to external shock forces such as often encountered during a drop event when the instrument 10 is accidentally dropped from a user's hand. If the heatsink 202 were directly mechanically attached to the cooler 200 for heat transfer purposes, then the relatively larger mass of the heatsink would likely damage the cooler during a drop event.

A bracket 210 is used in accordance with this invention to mechanically isolate the heatsink from the cooler, but without compromising the heat transfer. The bracket 210 includes a planar mounting leg 212 for supporting the heatsink by threading fasteners (not illustrated) through the mounting holes 214 into the base 204. A thermally conductive paste could be introduced between the mounting leg 212 and the base 204.

The bracket 210 also includes a planar support leg 216 having a plurality of elongated mounting slots 218, 220, 222, 224 into which a corresponding plurality of threaded fasteners 226, 228, 230, 232 are received for threaded engagement into holes 234, 236, 238, 240 formed in the support 100. The support leg 216 is preferably perpendicular to the mounting leg 212. The support leg 216 lies underneath a bottom surface of the support 100 when the fasteners are fully threaded into their holes (see FIG. 9), in which case the mounting leg 212 is positioned generally parallel to a side surface of the support.

Figure 9:
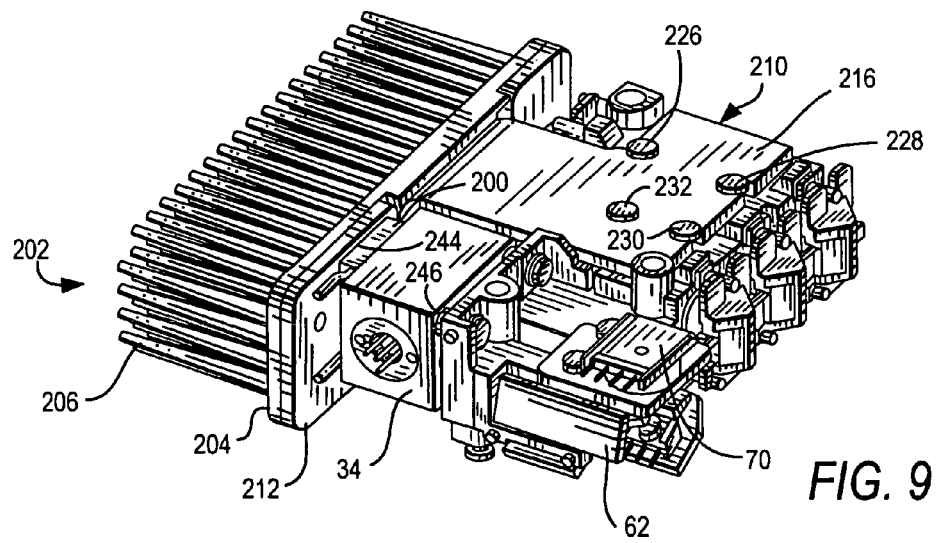
FIG. 9 is an assembled view of the arrangement of FIG. 8.

The mounting leg has a planar contact face 242 which is movable in mutual parallelism with a corresponding planar face on the cooler 200. During assembly, and prior to the fasteners 226, 228, 230, 232 being fully threaded into their corresponding holes, the slots 218, 220, 222, 224 permit such movement of the contact face 242 toward the cooler 200. In the preferred embodiment, a planar, thermally conductive, resilient, aluminum-filled, adhesive pad 244 is positioned between the contact face 242 and the cooler 200. The adhesive is only provided on the side of the pad facing the cooler so as to adhere thereto. The other side of the pad has no adhesive, but can, if desired, be coated with a thermally conductive paste. The movement of the contact face 242 continues until the contact face presses firmly and uniformly against the pad to ensure good thermal contact therewith. There is no direct physical coupling, however, since the contact face 242 is free to slide relative to the pad, whether or not coated with the thermal paste. It is currently preferred to use Chomerics brand, 9 mils thick, tape, Model No. T412, for the pad 244. Once fully assembled, as shown in FIG. 9, any sudden deceleration or shock forces experienced during a drop event by the heatsink will not be transmitted to the cooler 200 and/or the laser module 34, but instead, will be transmitted to the support 100 via the bracket 210. The heatsink essentially "floats" relative to the cooler since the contact face 242 is in sliding contact with the pad 244. This shock-resistant arrangement can survive shock forces on the order of 1500 g deceleration without the cooler and/or the module being damaged or dislodged.

Since the bracket is typically made of a heat conductive material, any heat in the support, for example, from the red and blue lasers 22,28, or from the drives 66, 70 can be transferred along the bracket to the heatsink. The bracket could also be thermally insulated from the support. In order not to overtax the cooler 200, the green laser module 34 is thermally insulated from the support by thermal insulators 246, preferably configured as washers. Other configurations for the bracket 210 are contemplated, for example, the legs 216, 212 need not be perpendicular, but could be oriented at an acute angle relative to one another.

Although the invention has been illustrated as protecting a cooler and a green laser module from shock damage, the invention is applicable to any heat source requiring an aggressive heat transfer to resist overheating and, therefore, requiring a heatsink of relatively large mass compared to the heat source to be protected.

It will be understood that each of the elements described above, or two or more together, also may find a useful application in other types of constructions differing from the types described above.

While the invention has been illustrated and described as embodied in a shock-resistant arrangement and method, particularly for use in a color image projection system and method, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention and, therefore, such adaptations should and are intended to be comprehended within the meaning and range of equivalence of the following claims.

What is claimed as new and desired to be protected by Letters Patent is set forth in the appended claims.

I claim:

1. A shock-resistant arrangement, comprising:
    a laser module for generating a laser beam with concomitant generation of waste heat;
    a thermo-electric cooler for cooling the laser module with concomitant generation of heat;
    a support for supporting the laser module and the cooler;
    a heatsink having a mass in thermal transfer relation with the laser module and the cooler to transfer the heat therefrom; and
    means for mechanically decoupling the mass from the laser module and the cooler by securing the heatsink to the support at a location remote from the laser module and the cooler to resist shock forces from being transmitted to the laser module and the cooler from the heatsink.

2. The arrangement of claim 1, and thermal insulators between the laser module and the cooler and the support for resisting thermal transfer between the laser module and the cooler and the support.

3. The arrangement of claim 1, wherein the decoupling means includes a bracket for supporting the heatsink, and a contact face in thermal transfer relation with the laser module and the cooler.

4. The arrangement of claim 3, wherein the bracket is adjustably mounted on the support to adjustably position the contact face in sliding contact with the laser module and the cooler.

5. The arrangement of claim 3, wherein the decoupling means includes a thermally conductive pad between the contact face and the laser module and the cooler.

6. The arrangement of claim 5, wherein the pad has an adhesive surface for adhering to the laser module and the cooler and is compressible to enhance the thermal transfer relation between the contact face and the laser module and the cooler.

7. A shock-resistant arrangement for protecting an image projection system from damage, comprising:
    a laser module for generating a laser beam with concomitant generation of waste heat;
    a support for supporting the laser module;
    a scanner on the support, for sweeping the laser beam as a pattern of scan lines away from the support, each scan line having a number of pixels;
    a controller for causing selected pixels to be illuminated, and rendered visible, by the laser beam to produce an image;
    a thermo-electric cooler mounted on the laser module, for cooling the laser module with concomitant generation of heat;
    a heatsink having a mass in thermal transfer relation with the cooler to transfer the heat therefrom; and means for mechanically decoupling the mass from the cooler by securing the heatsink to the support at a location remote from the cooler and the laser module to prevent shock forces from being transmitted from the heatsink to the cooler and the laser module.

8. The arrangement of claim 7, wherein the decoupling means includes a bracket having a mounting leg on which the heatsink is mounted, and a support leg connected to the support; and wherein the mounting leg has a contact face in thermal transfer relation with the cooler.

9. The arrangement of claim 8, wherein the decoupling means includes a thermally conductive pad between the contact face and the cooler, and wherein the contact face is in sliding contact with the pad, and wherein the pad is adhered to the cooler.

10. The arrangement of claim 7, wherein the laser beam has a green color.

11. A shock-resistant method, comprising the steps of:
generating a laser beam with concomitant generation of waste heat with a laser module;
cooling the laser module with concomitant generation of heat with a thermo-electric cooler;
supporting the laser module and the cooler on a support;
transferring the heat from the laser module and the cooler with a heatsink having a mass; and
mechanically decoupling the mass from the laser module and the cooler by securing the heatsink to the support at a location remote from the laser module and the cooler to resist shock forces from being transmitted to the laser module and the cooler from the heatsink.

12. The method of claim 11, wherein the decoupling step is performed by mounting the heatsink on a bracket, and by mechanically connecting the bracket to the support.

13. The method of claim 12, wherein the bracket has a contact face, and further comprising the step of adjusting the contact face into thermal transfer contact with the laser module and the cooler.

14. The method of claim 13, and further comprising the step of positioning a thermally conductive pad between the contact face and the laser module and the cooler.

15. A shock-resistant arrangement for protecting a heat source from damage, comprising:
a support for supporting the heat source, the support having a major surface and a side surface;
a heatsink having a plurality of cooling fins extending away from the side surface of the support and a mass in thermal transfer relation with the to transfer heat therefrom; and
means for mechanically decoupling the mass from the by securing the heatsink to the support at a location remote from the to resist shock forces from being transmitted to the from the heatsink, the decoupling means including a bracket for supporting the heatsink, and a contact face in thermal transfer relation with the heat source, the bracket having a support leg generally parallel, and secured to, the major surface of the support, and a mounting leg on which the heatsink is mounted and overlying the side surface of the support.

16. The arrangement of claim 15, wherein the support leg has a plurality of elongated slots into which a corresponding plurality of fasteners are adjustably positioned in order to adjustably position the mounting leg of the bracket relative to the side surface of the support.

* * * * *